United States Patent
Ward et al.

(10) Patent No.: US 10,157,979 B2
(45) Date of Patent: Dec. 18, 2018

(54) HIGH VOLTAGE SEMICONDUCTOR DEVICE WITH REDUCED PEAK ELECTRIC FIELD IN ACTIVE AND TERMINATION AREAS OF THE DEVICE

(71) Applicant: Anvil Semiconductors Limited, Coventry (GB)

(72) Inventors: Peter Ward, Peterborough (GB); Neophytos Lophitis, Hinckley (GB); Tanya Trajkovic, Cambridge (GB); Florin Udrea, Cambridge (GB)

(73) Assignee: Anvil Semiconductors Limited, Coventry (GB)

( * ) Notice: Subject to any disclaimer, the term of this patent is extended or adjusted under 35 U.S.C. 154(b) by 0 days.

(21) Appl. No.: 15/509,517

(22) PCT Filed: Sep. 17, 2015

(86) PCT No.: PCT/GB2015/052689
§ 371 (c)(1),
(2) Date: Mar. 8, 2017

(87) PCT Pub. No.: WO2016/042330
PCT Pub. Date: Mar. 24, 2016

(65) Prior Publication Data
US 2017/0243937 A1 Aug. 24, 2017

(30) Foreign Application Priority Data
Sep. 17, 2014 (GB) .................................. 1416403.2

(51) Int. Cl.
*H01L 29/78* (2006.01)
*H01L 29/06* (2006.01)
(Continued)

(52) U.S. Cl.
CPC ........ *H01L 29/0619* (2013.01); *H01L 21/266* (2013.01); *H01L 29/0834* (2013.01);
(Continued)

(58) Field of Classification Search
None
See application file for complete search history.

(56) References Cited

U.S. PATENT DOCUMENTS

| 4,837,606 A | 6/1989 | Goodman et al. |
| 5,780,878 A | 7/1998 | Bhatnagar et al. |

(Continued)

FOREIGN PATENT DOCUMENTS

| CN | 201725794 U | 1/2011 |
| EP | 0822600 A1 | 2/1998 |

(Continued)

OTHER PUBLICATIONS

Zhu, L., "Performance comparison of 1.5kV 4H-SiC buried channel and lateral channel JBS rectifiers," Materials Science Forum, Trans Tech Publications Ltd—Switzerland, CH, Jan. 1, 2006, pp. 1159-1162.

(Continued)

*Primary Examiner* — Minh-Loan Tran
(74) *Attorney, Agent, or Firm* — Tucker Ellis LLP

(57) ABSTRACT

We disclose a high voltage semiconductor device comprising a semiconductor substrate of a second conductivity type; a semiconductor drift region of the second conductivity type disposed over the semiconductor substrate, the semiconductor substrate region having higher doping concentration than the drift region; a semiconductor region of a first conductivity type, opposite to the second conductivity type, formed on the surface of the device and within the semiconductor drift region, the semiconductor region having higher doping concentration than the drift region; and a lateral extension of (Continued)

the first conductivity type extending laterally from the semiconductor region into the drift region, the lateral extension being spaced from a surface of the device.

20 Claims, 8 Drawing Sheets

(51) Int. Cl.
*H01L 29/66* (2006.01)
*H01L 29/786* (2006.01)
*H01L 29/861* (2006.01)
*H01L 29/872* (2006.01)
*H01L 29/10* (2006.01)
*H01L 29/16* (2006.01)
*H01L 29/20* (2006.01)
*H01L 29/40* (2006.01)
*H01L 21/266* (2006.01)
*H01L 27/112* (2006.01)
*H01L 29/267* (2006.01)
*H01L 29/36* (2006.01)
*H01L 29/08* (2006.01)
*H01L 29/47* (2006.01)
*H01L 29/739* (2006.01)
*H01L 29/778* (2006.01)
*H01L 29/868* (2006.01)

(52) U.S. Cl.
CPC ...... *H01L 29/1095* (2013.01); *H01L 29/1602* (2013.01); *H01L 29/1608* (2013.01); *H01L 29/2003* (2013.01); *H01L 29/402* (2013.01); *H01L 29/66674* (2013.01); *H01L 29/66712* (2013.01); *H01L 29/7802* (2013.01); *H01L 29/7827* (2013.01); *H01L 29/78642* (2013.01); *H01L 29/8611* (2013.01); *H01L 29/872* (2013.01); *H01L 27/11273* (2013.01); *H01L 29/0649* (2013.01); *H01L 29/083* (2013.01); *H01L 29/0878* (2013.01); *H01L 29/267* (2013.01); *H01L 29/36* (2013.01); *H01L 29/47* (2013.01); *H01L 29/475* (2013.01); *H01L 29/7395* (2013.01); *H01L 29/778* (2013.01); *H01L 29/7811* (2013.01); *H01L 29/868* (2013.01)

(56) References Cited

U.S. PATENT DOCUMENTS

| | | | |
|---|---|---|---|
| 7,923,804 B2* | 4/2011 | Zeng | H01L 29/0615 257/483 |
| 8,026,160 B2* | 9/2011 | Tarui | H01L 29/0615 257/E21.043 |
| 2003/0218188 A1 | 11/2003 | Jeon et al. | |
| 2004/0232450 A1 | 11/2004 | Yilmaz | |
| 2008/0277668 A1 | 11/2008 | Yoshikawa | |
| 2009/0114969 A1 | 5/2009 | Suzuki et al. | |
| 2009/0134405 A1 | 5/2009 | Ota | |
| 2009/0206913 A1 | 8/2009 | Zeng | |
| 2009/0261348 A1 | 10/2009 | Tarui et al. | |
| 2009/0294849 A1 | 12/2009 | Min et al. | |
| 2011/0241114 A1 | 10/2011 | Su et al. | |
| 2014/0361312 A1 | 12/2014 | Yoshikawa et al. | |

FOREIGN PATENT DOCUMENTS

| | | |
|---|---|---|
| EP | 0869558 A2 | 10/1998 |
| FR | 2963985 A1 | 2/2012 |
| JP | H05259443 A | 1/1992 |
| JP | 2008004643 A | 6/2006 |
| WO | 02/084745 A2 | 10/2002 |

OTHER PUBLICATIONS

International Search Report and Written Opinion from corresponding International Patent Application No. PCT/GB2015/052689, dated Dec. 2, 2015.

Search Report from corresponding European Application No. GB1416403.2 dated Jun. 29, 2015.

Search Report from corresponding European Application No. GB1416403.2 dated Mar. 10, 2015.

* cited by examiner

HIGH VOLTAGE SEMICONDUCTOR DEVICE WITH REDUCED PEAK ELECTRIC FIELD IN ACTIVE AND TERMINATION AREAS OF THE DEVICE

FIELD OF THE INVENTION

This invention relates to a power semiconductor device, particularly but not exclusively, to a wide band-gap material based power semiconductor device.

BACKGROUND TO THE INVENTION

The wide band-gap of SiC (irrespective of polytype) results in a very high critical electrical field before avalanche breakdown. This critical field is roughly ten times that of Si and as a consequence one tenth of the thickness of material is needed to sustain a given voltage in the off state, which in turn leads to a much lower resistance in the on-state. This lower resistance reduces the power dissipation in the device resulting in overall system energy savings.

However, care must be taken when calculating the actual breakdown voltage of a real device since the theoretical critical electric fields assume an infinite planar junction. However, in the real case field intensification occurs around the edges of a diffused region and the breakdown voltage is reduced as a strong function of the radius of curvature of the structure. (see for example: J Baliga, Fundamentals of Power Semiconductor Devices, page 108).

This problem is well understood in the context of Si devices and solutions are found by adding further field relief structures around the edges of active junction (J Baliga, Fundamentals of Power Semiconductor Devices, page 130). Such a field relief structure is shown in FIG. 1. The field relief structures can gradually release the depletion region at the edge of the device. The voltage is supported between each pair of p+ rings, thus reducing the crowding of the electric field at the surface. The spacing and depth of the rings are designed such that the electric field peaks at the surface between each pair of rings are almost equal and the breakdown voltage of the final structure is significantly increased.

Junction Termination Extension (JTE) structures have also been proposed in Si based devices. Such a JTE structure is shown in FIG. 2. This structure uses multiple zones with the doping level decreasing from the active area towards the end of the termination. The effect is similar to that achieved by the field rings—that is the gradual release of the depletion region at the edge of the device. The voltage is ideally supported uniformly along the JTE zones.

However, SiC presents new challenges in this area, most importantly as mentioned above, the electric fields in SiC are very high and so this field intensification problem is much more severe. Consequently to extrapolate the Si solution above to SiC would result in very complex structures with much smaller dimensions to the extent of not being practical using normal production equipment.

Furthermore, the material itself presents problems; since dopant diffusion is negligible in SiC the deep, slowly curving diffused structures used in Si cannot be reproduced, and the alternative dopant introduction method of ion implantation by its very nature cannot give the same structure. In fact the only practical method of introducing localised doping in SiC is ion implantation, but again keeping implantation energies within the scope of production equipment results is rather shallow junctions of the order of 0.5 microns deep which exacerbates the whole problem.

It is an object of the present invention to address the problems above.

SUMMARY

Aspects and preferred features are set out in the accompanying claims.

We disclose herein a wide band-gap high voltage semiconductor device comprising:
- a semiconductor substrate;
- a semiconductor drift region of a second conductivity type disposed on the semiconductor substrate;
- a body region of a first conductivity type, opposite to the second conductivity type, located within the semiconductor drift region;
- a source region of the second conductivity type located within the body region;
- a gate placed above and in contact to the source region, the gate to control charge in a channel region between the semiconductor drift region and the source region and to thereby control flow of charge within the semiconductor drift region;
- wherein the body region comprises a lateral extension of the first conductivity type extending laterally into the drift region, the lateral extension being spaced from the surface of the transistor.

The surface of the transistor may be parallel to the channel region. The surface of the device may be defined by a plane on which the source contact and the gate of the transistor are formed.

The lateral extension may be vertically spaced from the surface of the transistor. The term "vertical" is related to a transverse distance from the gate.

The entire lateral extension may be vertically spaced from the surface of the transistor.

The body region may comprise a first portion adjacent (or immediately below) the gate and a second portion located deeper than the first portion, the doping concentration of the first portion may be higher than the doping concentration of the second portion. The body region may also include a p+ region in contact with the n+ source region. The p+ and n+ regions are shorted with a source contact or electrode. When shorted, the p+ region may also form part of the source region. It will be appreciated that the source region is the same as the collector of an insulated gate bipolar transistor (IGBT), and therefore the source region also covers the collector operation when the IGBT structure is considered.

The lateral extension may extend laterally only from the second deeper portion of the body region. The term "lateral" is related to extending in a direction parallel to the gate or other contacts of the device.

The doping concentration of the lateral extension may be substantially the same as the doping concentration of the second deeper portion of the body region. The term "substantially" relates to almost the same. It will be appreciated that the doping concentration or dose of the lateral extension can be optimised during the manufacturing process so that an improved (desired) breakdown voltage can be achieved.

The lateral extension may extend from the body region in a lateral direction which is opposite to a direction to which the gate extends from the source to the drift region. The transistor may include a field oxide or insulator adjacent or in contact with the source terminal/electrode. The source electrode may extend over the field oxide to form a field plate. The lateral extension may laterally extend further into the drift region compared to the field plate extension over the field oxide. The thickness of the field plate may be optimised and combined with the field plate extension and the dose optimisation of the lateral extension to achieve an improved breakdown voltage. The length of the lateral extension may be varied to achieve an improved breakdown voltage. It will be appreciated that the term "length" refers to the distance between the edge of the p+ region and the outer edge of the lateral extension.

The lateral extension may operate as a termination structure in the transistor. The lateral extension may be used in transistor structures located on the periphery of a device where a termination structure (or a guard ring) is generally desirable.

The transistor may be configured such that the electric field formed at the vertical junctions between the lateral extension and the drift region reduces the electric field formed between the body region and drift region at the surface of the transistor. It will be appreciated that the vertical junction is a p-n junction in which the p region and the n region are located vertically to one another. The electric field created by the vertical junctions between the lateral extension and the drift region are particularly advantageous. The p-n junction created at the surface by the body region and drift region is a lateral junction as the p region (body region) and the n region (drift region) are formed laterally to one another. Therefore the lateral extension is configured to reduce peak electric field in both the active and termination areas of the device.

The drift region may be configured to be depleted of mobile carriers at breakdown voltage during an off-state blocking mode of the transistor and able to conduct charge during an on-state conducting mode of the transistor.

The semiconductor substrate may comprise monocrystalline silicon material.

The semiconductor drift region, the body region and the source region may each comprise a material comprising 3-step cubic silicon carbide (3C-SiC).

The semiconductor substrate, the semiconductor drift region, the body region and the source region may each comprise a material comprising 4-step hexagonal silicon Carbide (4H-SiC).

The semiconductor substrate, the semiconductor drift region, the body region, the lateral extension and the source region may each comprise a material comprising gallium nitride (GaN).

The semiconductor substrate may comprise monocrystalline silicon material, and the semiconductor drift region, the body region, the lateral extension and the source region may each comprise a material comprising GaN. Alternatively the semiconductor substrate may comprise SiC material, and the semiconductor drift region, the body region, the lateral extension and the source region may each comprise a material comprising GaN.

The transistor may further comprise a first semiconductor region disposed between the semiconductor substrate and the drift region, the first semiconductor region comprising a material comprising 3C-SiC, 4H-SiC or GaN. It will be appreciated that the transistor structure can be made of other wide band-gap materials such as 6H-SiC and diamond. It will be also appreciated that the lateral extension as described above can be used in a lateral high-electron-mobility transistor (HEMT) using GaN material. The skilled person would understand that the HEMT is generally a lateral semiconductor device in which the lateral extension can be used as a termination structure.

The first semiconductor region may be of a second conductivity type and the semiconductor substrate may be of a second conductivity type. The transistor may be a vertical power metal-oxide-semiconductor field effect transistor (MOSFET).

The first semiconductor region may be of a first conductivity type and the semiconductor substrate is of a first conductivity type. The transistor may be a vertical power insulated gate bipolar transistor (IGBT).

We also disclose herein a wide band-gap high voltage semiconductor device comprising:
 a semiconductor substrate of a second conductivity type;
 a first semiconductor region of the second conductivity type disposed on the semiconductor substrate;
 a semiconductor drift region of the second conductivity type disposed on the first semiconductor region, the first semiconductor region having higher doping concentration than the drift region;
 a body region of the first conductivity type, opposite the second conductivity type, located within the semiconductor drift region;
 wherein the body region comprises a lateral extension of the first conductivity type extending laterally into the drift region, the lateral extension being spaced from the surface of the device.

The lateral extension may be vertically spaced from the surface of the device. The entire lateral extension may be vertically spaced from the surface of the device. The device may be a vertical PIN diode.

The semiconductor substrate may comprise monocrystalline silicon material. The first semiconductor region, the semiconductor drift region, the lateral extension and the body region may each comprise a material comprising 3-step cubic silicon carbide (3C-SiC).

The semiconductor substrate, the first semiconductor region, the semiconductor drift region, the lateral extension and the body region may each comprise a material comprising 4H-SiC.

The semiconductor substrate, the first semiconductor region, the semiconductor drift region, the lateral extension and the body region may each comprise a material comprising GaN.

The semiconductor substrate may comprise monocrystalline silicon material, and the first semiconductor region, the semiconductor drift region, the lateral extension and the body region may each comprise a material comprising GaN.

The semiconductor substrate may comprise SiC material, and the first semiconductor region, the semiconductor drift region, the lateral extension and the body region may each comprise a material comprising GaN.

We disclose herein a high voltage semiconductor device comprising:
 a semiconductor substrate of a second conductivity type;
 a first semiconductor region of the second conductivity type disposed on the semiconductor substrate;
 a semiconductor drift region of the second conductivity type disposed on the first semiconductor region, the first semiconductor region having higher doping concentration than the drift region;
 a Schottky metal contact formed directly on the semiconductor drift region on a surface of the device;
 a second semiconductor region of a first conductivity type, opposite to the second conductivity type, formed on the surface of the device and within the semiconductor drift region, the second semiconductor region having higher doping concentration than the drift region; and a lateral extension of the first conductivity type extending laterally from the second semiconductor region into the drift region, the lateral extension being spaced from the surface of the device.

The lateral extension may be vertically spaced from the surface of the device. The entire lateral extension may be vertically spaced from the surface of the device.

The lateral extension may extend laterally only from a deeper portion of the second semiconductor region. The doping concentration of the lateral extension may be lower than the second semiconductor region. The lateral extension may extend laterally towards the Schottky metal contact. The length of the lateral extension may be adjusted to achieve the optimum result in the Schottky diode. Here the term "length" refers to the distance from the edge of the second semiconductor region to the edge of the lateral extension under the Schottky contact. The lateral extension under the edges of the Schottky region may act as a shield in a reverse bias operation.

The device may further comprise a first ohmic contact operatively connected to the first semiconductor region and a second ohmic contact formed on the second semiconductor region.

The semiconductor substrate, the first semiconductor region, the drift region, the second semiconductor region and the lateral extension may each comprise monocrystalline silicon material.

The semiconductor substrate, the first semiconductor region, the drift region, the second semiconductor region and the lateral extension may each comprise 4H-SiC.

The semiconductor substrate may comprise monocrystalline silicon material, and the first semiconductor region, the drift region, the second semiconductor region and the lateral extension may each comprise 3C-SiC.

The semiconductor substrate, the first semiconductor region, the drift region, the second semiconductor region and the lateral extension may each comprise GaN.

The semiconductor substrate may comprise monocrystalline silicon material, and the first semiconductor region, the drift region, the second semiconductor region and the lateral extension may each comprise GaN.

The semiconductor substrate may comprise SiC material, and the first semiconductor region, the drift region, the second semiconductor region and the lateral extension may each comprise GaN.

We disclose herein a method for manufacturing a wide band-gap high voltage semiconductor transistor, the method comprising:
  forming a semiconductor substrate;
  forming a semiconductor drift region of a second conductivity type on the semiconductor substrate;
  forming a body region of a first conductivity type, opposite the second conductivity type, located within the semiconductor drift region;
  forming a lateral extension of the first conductivity type extending laterally from the body region into the drift region, the lateral extension being spaced from the surface of the transistor;
  forming a source region of the second conductivity type located within the body region;
  forming a gate placed above and in contact to the source region, the gate to control charge in a channel region between the semiconductor drift region and the source region and to thereby control flow of charge within the semiconductor drift region.

The forming of the lateral extension may comprise applying a two stage photo-masking to implant the lateral extension. The lateral extension may be ion-implanted using Aluminium or Boron material. It will be appreciated that using Boron can be advantageous because Boron has a lighter atom and therefore it is generally easier to form a deeper implant using this material.

The method may further comprise vertically spacing the lateral extension from the surface of the transistor.

The method may further comprise forming a first semiconductor region between the semiconductor substrate and the drift region.

The method may further comprise forming the semiconductor substrate using a material comprising monocrystalline silicon, and forming each of the semiconductor drift region, the first semiconductor region, the body region, the lateral extension and the source region using a material comprising 3-step cubic silicon carbide (3C-SiC).

The method may further comprise forming each of the semiconductor substrate, the first semiconductor region, the semiconductor drift region, the body region, the lateral extension and the source region using a material comprising 4H-SiC.

The method may further comprise forming each of the semiconductor substrate, the semiconductor drift region, the body region, the lateral extension and the source region using a material comprising GaN.

The method may further comprise forming the semiconductor substrate using monocrystalline silicon material, and forming each of the semiconductor drift region, the body region, the lateral extension and the source region using a material comprising GaN.

The method may further comprise forming the semiconductor substrate using SiC material, and forming each of the semiconductor drift region, the body region and the source region using a material comprising GaN.

We disclose herein a method of manufacturing a high voltage semiconductor device, the method comprising:
  forming a semiconductor substrate of a second conductivity type;
  forming a first semiconductor region of the second conductivity type disposed on the semiconductor substrate;
  forming a semiconductor drift region of the second conductivity type disposed on the first semiconductor region, the first semiconductor region having higher doping concentration than the drift region;
  forming a Schottky metal contact formed directly on the semiconductor drift region on a surface of the device;
  forming a second semiconductor region of a first conductivity type, opposite to the second conductivity type, formed on the surface of the device and within the semiconductor drift region, the second semiconductor region having higher doping concentration than the drift region; and
  forming a lateral extension of the first conductivity type extending laterally from the second semiconductor region into the drift region, the lateral extension being spaced from the surface of the device.

The step of forming the lateral extension may comprise applying a two stage photo-masking to implant the lateral extension. The lateral extension may be ion-implanted using Aluminium or Boron material.

The method may further comprise vertically spacing the lateral extension from the surface of the device.

The method may further comprise forming an ohmic contact on the second semiconductor material, the ohmic contact comprising titanium disilicide material.

The method may further comprise forming the Schottky contact using a relatively low temperature compared to that used for forming the ohmic contact, the Schottky contact comprising nickel material.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DETAILED DESCRIPTION OF THE PREFERRED EMBODIMENTS

Figure 3:
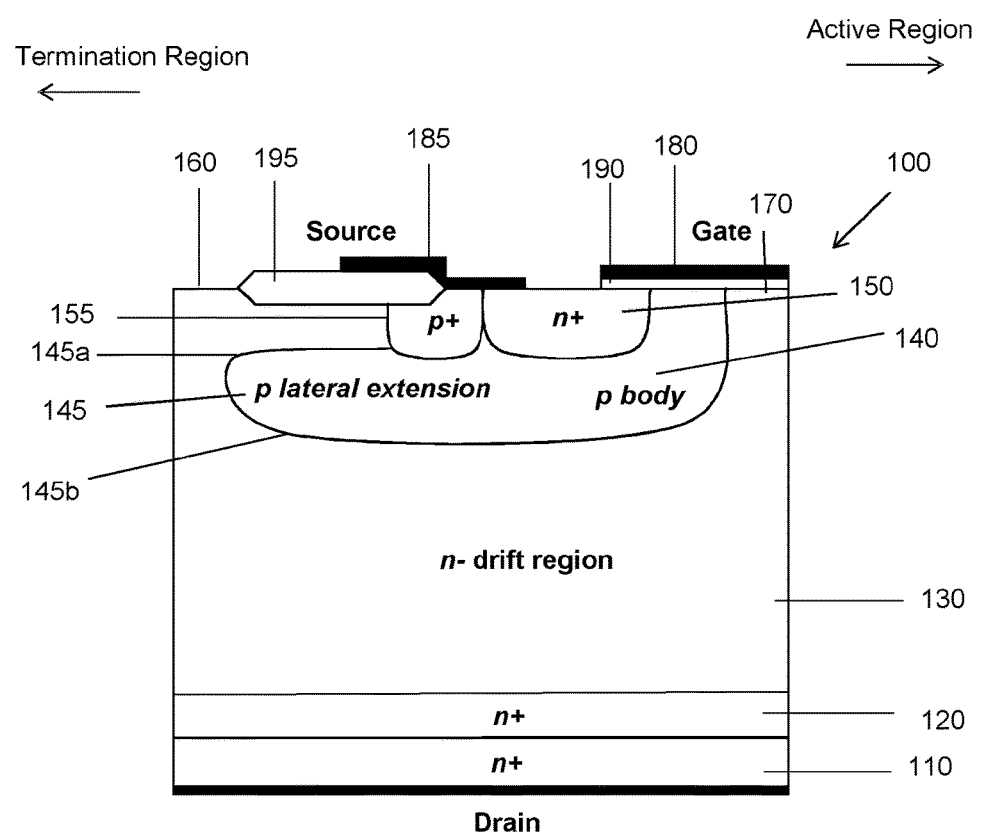
FIG. 3 illustrates a schematic cross section of a vertical MOSFET located adjacent to a termination region of the MOSFET.

Referring to FIG. 3, an example of a SiC based vertical power semiconductor transistor 100 in the form of a metal-oxide-semiconductor field effect transistor (MOSFET) is shown. The transistor 100 is an active transistor which can be arranged as the last active transistor among an array of transistors which is located adjacent a termination region. A highly doped n-type layer (or the first semiconductor region) 120 is formed on an n-type substrate 110. A drift region 130 is formed on the first semiconductor 120. A p-type well 140 is formed within the drift region 130. An n-type highly doped source region 150 is formed within the p-type well region 140. A p-type highly doped region is formed within the p-type well 140. The highly doped p and n type regions 150, 155 are shorted using a source contact or electrode 185. A field oxide or insulator 195 is also formed adjacent the highly doped p-type region 155 and the source contact extends over the field oxide 195. The extended source contact 185 is generally termed as a field plate. The P-type well 140 at the surface 160 of the epitaxial layer or the drift region 130 provides a body region. The N-type well 150 within the p-type wells 140 provides a contact region and provides a source. A channel 170 is formed beneath a gate 180 which is separated using a gate dielectric layer 190.

The MOSFET 100 also includes a lateral extension region 145 extending from the body region 140. The lateral extension 145 extends laterally from the lower part of the body region 140 into the drift region 130. The lateral extension 145 is formed using ion implantation together with two stage photo-masking to extend the lower part of the junction laterally. This lower implant is optimised in terms of dose and dimensions and is combined with an optimised field oxide 195 thickness and metal field plate 185. The lateral extension 145 extends towards the direction to which the field plate 185 extends over the field oxide 195 adjacent the source region. Generally the lateral extension 145 extends further/more than the field plate 195 extension. The lateral extension 145 allows higher breakdown voltage (Vbr) to be achieved than theoretical limits predict for the given doping level. Due to the presence of the lateral extension 145, a vertical p-n junction is formed between the upper surface 145a of the lateral extension and the drift region 130 which reduces peak electric field (EF). This structure is different from existing solutions which use lateral p-n junctions to achieve a similar result. A further vertical p-n junction is formed by the lower surface 145b of the lateral extension 145 and the drift region 130. This p-n junction can also contribute to achieve higher breakdown voltage.

The p-type body region 140 can have two portions. The first portion is the top portion in which the channel region 170 is formed. The highly doped p region 155 is also formed in the top portion of the body region 140. The top portion includes relatively higher doping concentration. The second portion is below the top portion and therefore is deeper than the top portion. The deeper portion includes relatively less doping concentration than the top portion. The lateral extension 145 is extended from the deeper portion of the body region 145. The doping concentration of the lateral extension is generally substantially the same as the doping concentration of the deeper portion of the body region 145. The doping concentration of the lateral extension is generally about $10^{16}$ cm$^{-3}$ to $10^{18}$ cm$^{-3}$, preferably about $10^{17}$ cm$^{-3}$ The lateral extension 145 is formed in such a way that there is a vertical space between the lateral extension 145 and the surface 160 of the device. In one example, the vertical space between the lateral extension 145 and the surface 160 of the device is about 0.05 μm to 0.6 μm, preferably about 0.1 μm.

The proposed lateral extension 145 (deep p-implant) can also help to reduce the peak electric field in the active area (e.g. in the drift region 130), at the top portion of the body region 140 and drift region junction (p+/n-epi junction) at the surface 160 of the device. Generally, in a conventional device, high drift region (n-epi) doping and p+ body region (in the top portion of the body region) curvature can lead to a higher electric field (EF) at the edge of the p+ body compared to the electric field (EF) at the vertical p+ body/n-epi junction in the active area of the device (when there is no lateral extension present in the structure). Lowering the drift region (n-epi) doping is not always possible and without it, the maximum achievable breakdown voltage (Vbr) will be limited by the curvature of the p+/n-epi junction. Using this lowly doped deep p-implant 145, or the lateral extension 145, as an extension of the body region 140 in the active area too, the peak electric field (EF) can be reduced leading to an increased breakdown voltage of the device (providing that the breakdown voltage in the termination is always higher than in the active region). The lateral extension 145 is formed by ion implantation of the aluminum material which is fully compatible in wide band-gap material (e.g. SiC) based fabrication techniques.

It will be appreciated that in the example of FIG. 3 the p-type lateral extension 145 is used near the termination region of the high voltage device. The lateral extension 145 may be implanted in devices which are located near the perimeter, outside or outer devices of an array of devices. The devices located in the central portion of the array may not have such lateral extension 145 structures. In the example of FIG. 3, the lateral extension structure 145 generally extends laterally into the drift region in a direction which is opposite to the direction to which the gate extends from source to the drift region. In other words, the lateral extension 145 is generally not below the channel region 170 in the device in the example of FIG. 3.

The transistor of FIG. 3 can be manufactured using a wide band-gap semiconductor material, for example, SiC, GaN and/or diamond. In one embodiment, the substrate 110, the first semiconductor layer 120, the drift region 130, the body region 140, the lateral extension 145, the source region 150 each include 4H-SiC material. Alternatively, the substrate 110 can include silicon material and the remaining regions can have 3C-SiC material. In this particular example, the MOSFET shown in FIG. 3 is able to support much greater breakdown voltages due to the use of 3C-SiC in the epitaxial drift region 130. At the same time the on-resistance of the 3C-SiC MOSFET can be significantly lower than the 4H-SiC MOSFET. This is because a better channel mobility is observed in 3C-SiC (compared to 4H-SiC) and therefore the on-resistance of the channel region formed between the drift region 130 and the source region 150 can be significantly reduced. It will be appreciated that, in an alternative embodiment, the substrate 110 can include GaN and the remaining regions can have GaN as well. It is also possible that the substrate includes silicon material and the remaining regions each include GaN. In one embodiment, the substrate 110 can include SiC and the remaining regions can each include GaN.

It will be appreciated that the first semiconductor region/layer 120 has two purposes: (1) it acts as a buffer layer between the substrate 110 and the drift region 130 to form a punch-through structure so that during the off-state operation the depletion region does not contact the substrate 110 from the drift region 130; (2) it reduces the interface defects between the substrate which is typically made of Silicon material and drift region 130 which is typically made of a wide band gap material such as 3C-SiC, 4H-SiC or GaN.

Figure 4:
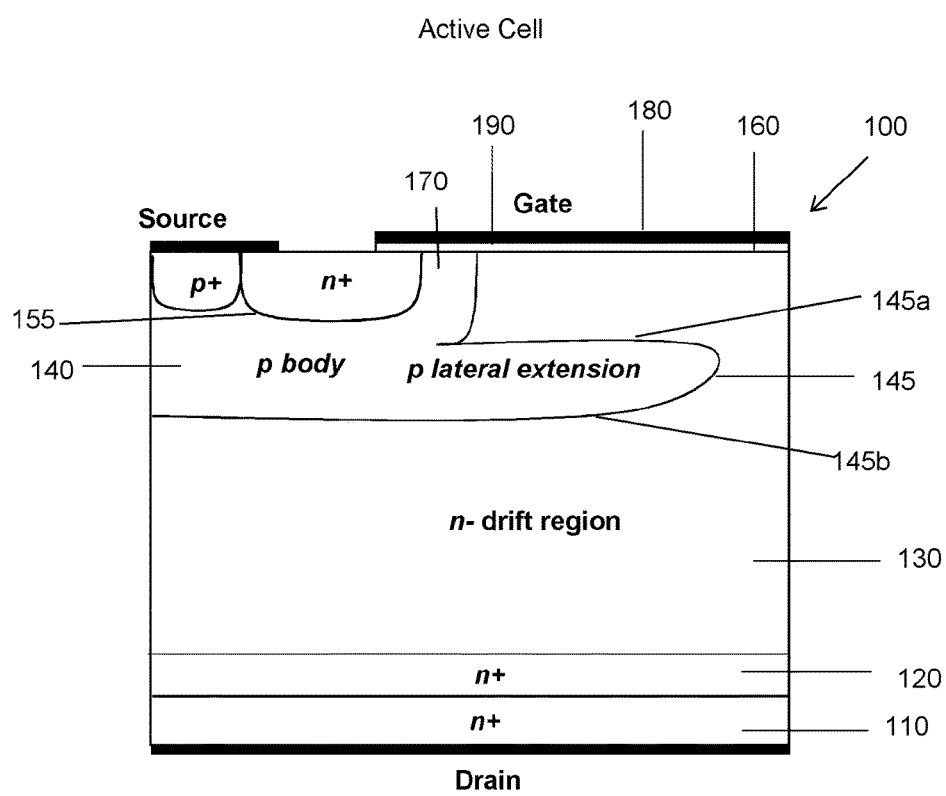
FIG. 4 illustrates a schematic cross section of an alternative vertical MOSFET located in an active region of the MOSFET.

Referring to FIG. 4, an alternative example of a vertical power MOSFET is shown. Many features of the MOSFET of FIG. 4 are the same as the MOSFET of FIG. 3 and therefore carry the same reference numbers. However, the MOSFET of FIG. 4 is an active transistor located in an active region of an array of MOSFETs on a chip. The lateral extension 145 of the transistor of FIG. 4 extends into the drift region 130 towards the gate 180. In other words, the lateral extension 145 is formed under the channel region of the MOSFET. The operation and features of the MOSFET of FIG. 4 are substantially the same as the operation of the MOSFET of FIG. 3.

Figure 1:
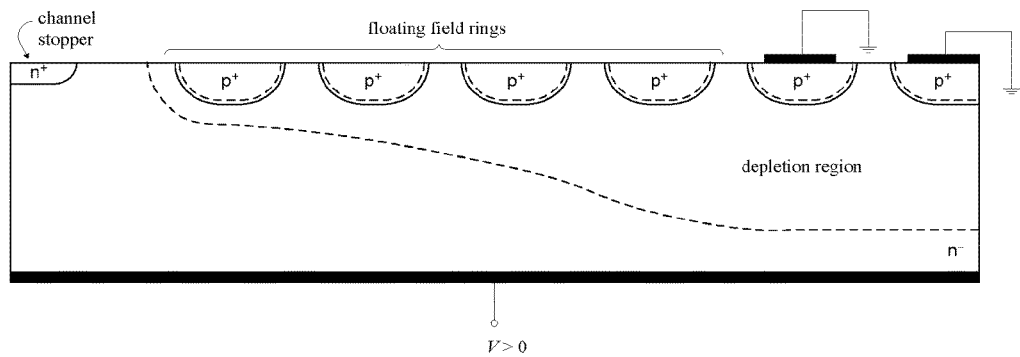
FIG. 1 illustrates a prior art Si based device in which floating field rings are formed to reduce curvature effect.
Figure 2:
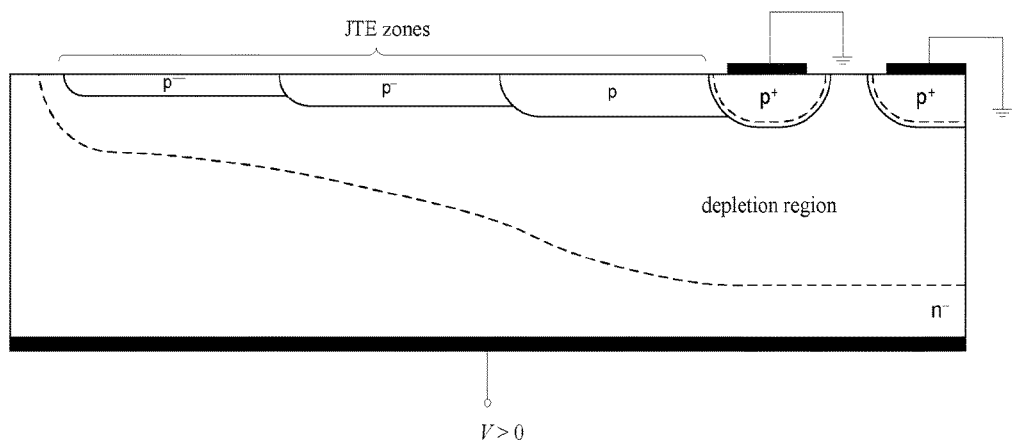
FIG. 2 illustrates a prior art Si based device in which junction termination structures are formed to reduce curvature effect.
Figure 5:
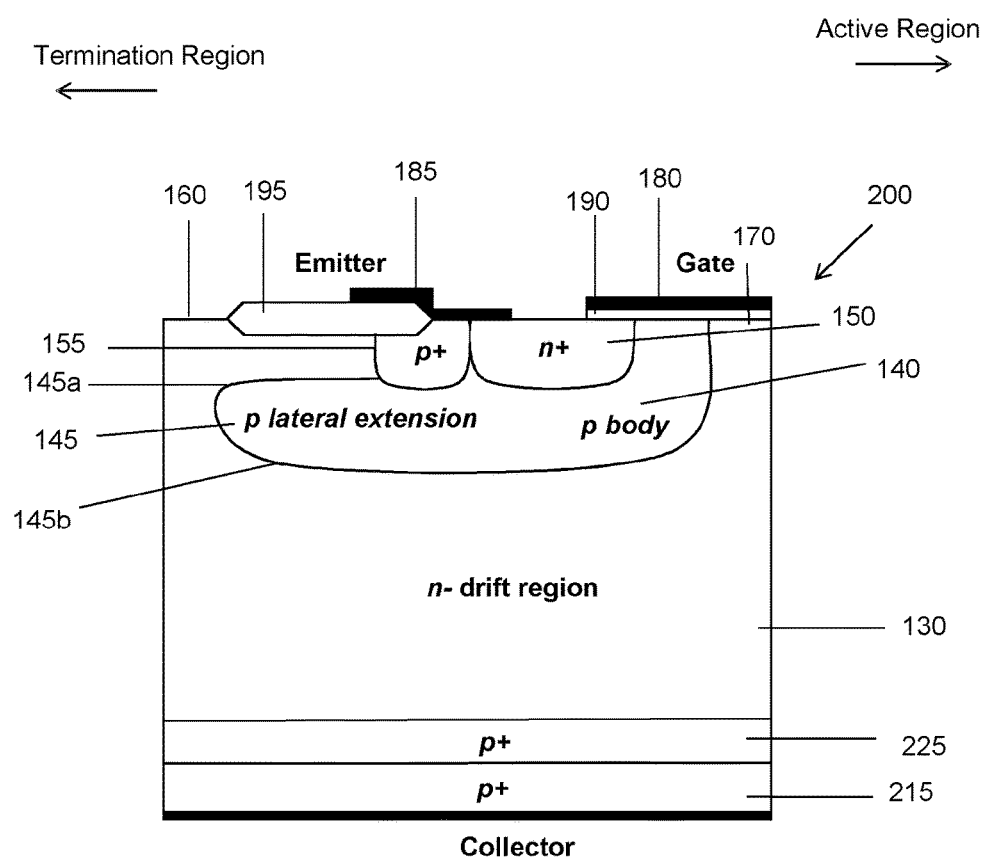
FIG. 5 illustrates a schematic cross section of a vertical IGBT located adjacent to a termination region of the IGBT.

Referring to FIG. 5, an example of a vertical power semiconductor transistor 200 in the form of an insulated gate bipolar transistor (IGBT) is shown. Many features of the IGBT in FIG. 5 are the same as the MOSFET of FIG. 3 and therefore carry the same reference numerals, except the IGBT 200 includes a p+ type substrate 215 and a p+ type collector layer or the first semiconductor region 225. The first semiconductor region 225 forms a carrier injector region in the IGBT. It will be appreciated that the off-state operation of the IGBT 200 is substantially similar to that of the MOSFET 100 of FIG. 3. In the off-state, the vertical junctions 145a, 145b between the lateral extension and drift region 130 help to reduce the peak electric field at the surface 160 of the device. Therefore the p-lateral extension 145 in the IGBT can act as a termination structure in the device. The doping concentration of the lateral extension 145 is substantially the same as that described for the MOSFET structure 100 in FIG. 1. The vertical distance between the p-lateral extension 145 and the surface 160 of the device is also substantially the same as the MOSFET 100 of FIG. 3. In this example, the IGBT of FIG. 5 is an active transistor which can be arranged as the last transistor among an array of transistors and the active transistor of FIG. 5 can be located adjacent a termination region.

Figure 6:
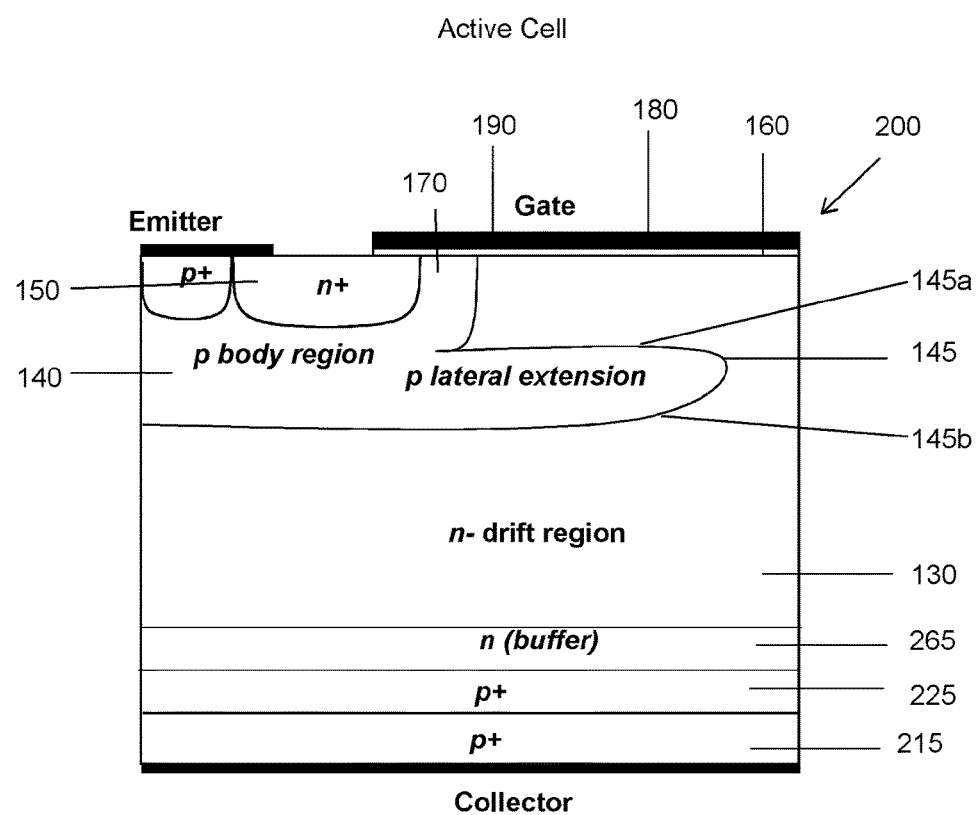
FIG. 6 illustrates a schematic cross section of an alternative vertical IGBT located in an active region of the IGBT.

In one embodiment, all the layers of the IGBT can have 4H-SiC. Alternatively, the p+ substrate can be made of silicon and the remaining layers can include 3C-SiC. It will be appreciated that a hetero-structure is formed between the p+ silicon substrate 215 and p+3C-SiC layer 225. The 3C-SiC material in the first semiconductor (epitaxial) region 225 (~2 microns) just above the SiC/Si interface is very heavily defective because of the lattice miss-match between the two materials and heavily doped with Al as-grown, consequently this defective region is very conductive. In this way the heterojunction structure and consequent potential barriers can be overcome by becoming a quasi-metallic interface due to the presence of the dislocations, Al doping during epitaxial growth and Boron up-diffusion from the Si substrate. It will be appreciated that, in an alternative embodiment, the substrate 215 can include GaN and the remaining regions can have GaN as well. It is also possible that the substrate 215 includes silicon material and the remaining regions each may include GaN. In one embodiment, the substrate 215 can include SiC and the remaining regions each may include GaN. Referring to FIG. 6, an alternative example of a vertical power IGBT is shown. Many features of the IGBT of FIG. 6 are the same as the IGBT of FIG. 5 and therefore carry the same reference numbers. However, the IGBT of FIG. 5 is an active transistor located in an active region of an array of IGBTs on a chip. The lateral extension 145 of the transistor of FIG. 6 extends into the drift region 130 towards the gate 180. In other words, the lateral extension 145 is formed under the channel region and the accumulation region (adjacent the channel region) of the IGBT. The operation and features of the IGBT of FIG. 6 are substantially the same as the operation of the IGBT of FIG. 5. A further difference between the IGBTs of FIGS. 5 and 6 is that it includes an n-type buffer layer 265 between the drift region 130 and the first semiconductor region 225. The buffer layer 265 stops the depletion region from the drift region 130 to extend to the first semiconductor region 225 during the off-state operation of the device.

Figure 7:
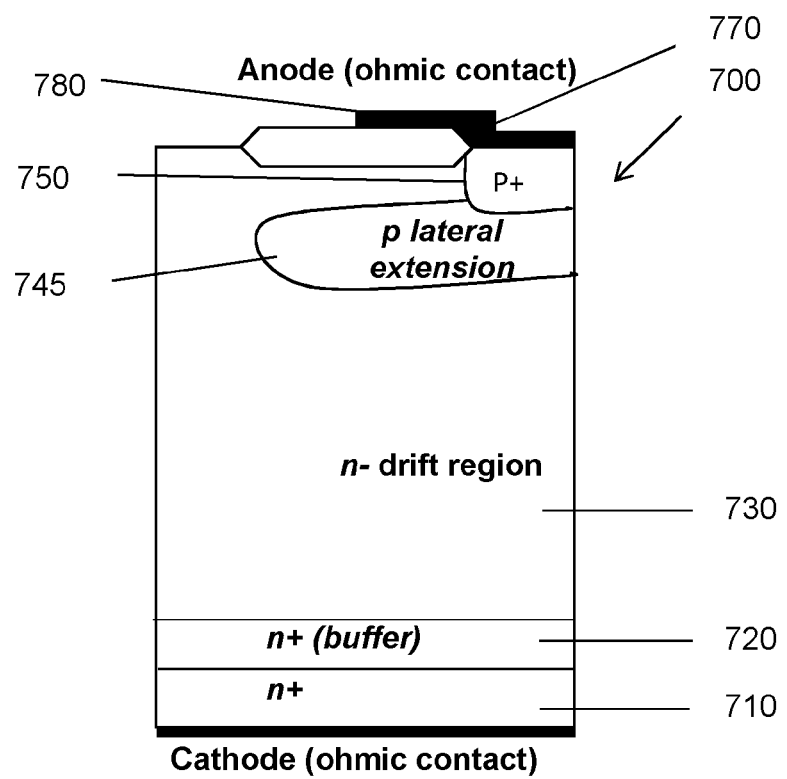
FIG. 7 illustrates a schematic cross section of a vertical PIN diode.

Referring to FIG. 7, an example of a vertical PIN diode 700 is shown. The PIN diode 700 includes a substrate 710 on which an n-type epitaxial layer (or the first semiconductor region) 720 is formed to provide a cathode contact. An n-type lowly doped drift region 730 is formed on the n-type epitaxial layer 720. A p+ doped region 750 formed in the drift region 730 and forms an anode contact region 770. The anode contact 770 extends over a field oxide 780 to form a field plate. A lateral extension 745 is formed from the deeper part of the p+ doped region 750 extending laterally into the drift region 730. The doping concentration adjacent the area of the lateral extension 745 and the p+ doped region can be slightly higher than the doping concentration of the drift region. In other words, a region having a slightly higher doping than the drift region can be formed adjacent the lateral extension 745 and the p+ doped region 750. In one example, the doping concentration of the region next to the lateral extension and p+ doped region is generally about above $10^{16}$ cm$^{-3}$ and the doping concentration of the drift region is about $10^{15}$ cm$^{-3}$. The doping concentration of the lateral extension 745 is about $10^{17}$ cm$^{-3}$.

In the off-state, the lateral extension 745 operates in the same way as described above in respect of the MOSFETs and IGBTs above. The vertical junctions between the lateral extension 745 and the drift region 730 helps to reduce the peak electric field at the surface of the device which is otherwise created due to the curvature of the p+ doped region 750 at the surface of the device. The field plate also helps to reduce the peak electric field at the surface of the device. Similar to the embodiments described above, the substrate 710 can include silicon material and the remaining layers can include 3C-SiC. Alternatively, all the layers of the PIN diode 700 can be made of 4H-SiC. Yet alternatively, the substrate 215 can include GaN and the remaining regions can have GaN as well. It is also possible that the substrate 215 includes silicon material and the remaining regions each include GaN. In one embodiment, the substrate 215 can include SiC and the remaining regions each may include GaN. It will be appreciated that the first semiconductor region 720 acts as a buffer layer which prevents the depletion region to extend from the drift region 730 to the substrate 710. The first semiconductor layer 720 also acts to reduce the defects in the interface between the substrate 710 and the first semiconductor region 720.

In one example, the diode of FIG. 7 is a discrete diode or part of an array of diodes. In a further example, the diode of FIG. 7 can be located in a termination region of any of the devices described in FIGS. 3 to 6.

Figure 8:
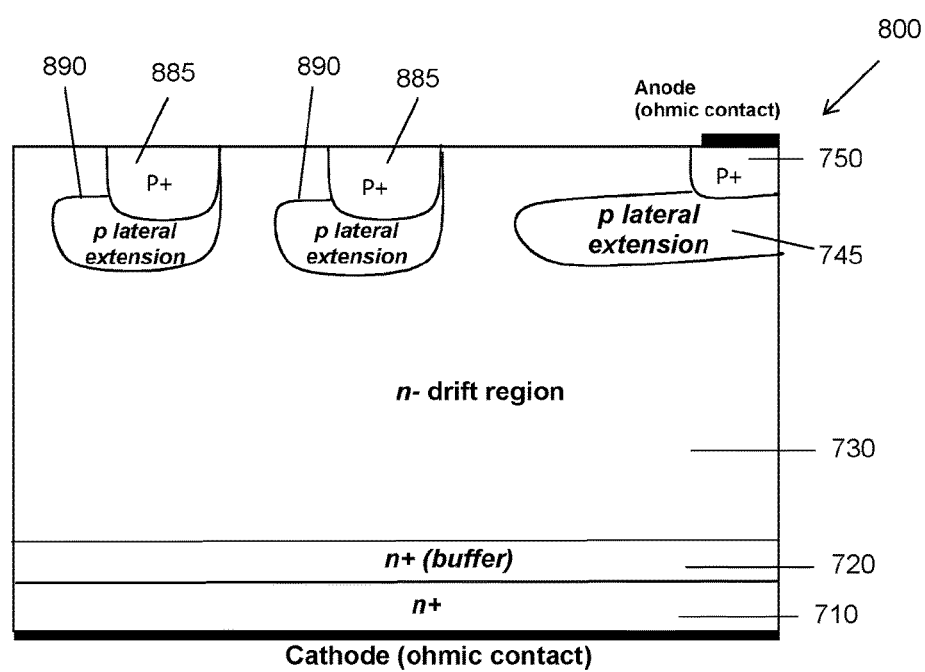
FIG. 8 illustrates a schematic cross section of a termination structure.

FIG. 8 illustrates an example of a termination structure 800 of a power semiconductor region in which lateral extensions according to the present invention are provided. Many features of FIG. 8 are the same as the features of FIG. 7 and therefore carry the same reference numbers. However, the termination structure of FIG. 8 includes floating guard rings 885 laterally distant from the p+ doped region 750. The field plate and field oxide of FIG. 7 are missing in FIG. 8, but it would be appreciated that these features can generally be present in the termination structure of FIG. 8. P-type lateral extensions 890 are extended into the drift region 730 from the lower part of the floating guard rings 885. The existence of the lateral extensions 890 from the floating guard rings 885 improves the breakdown voltage in the termination region. The termination structure 800 of FIG. 8 can be used in the termination region of the devices described above with reference to FIGS. 3 to 7.

Figure 9:
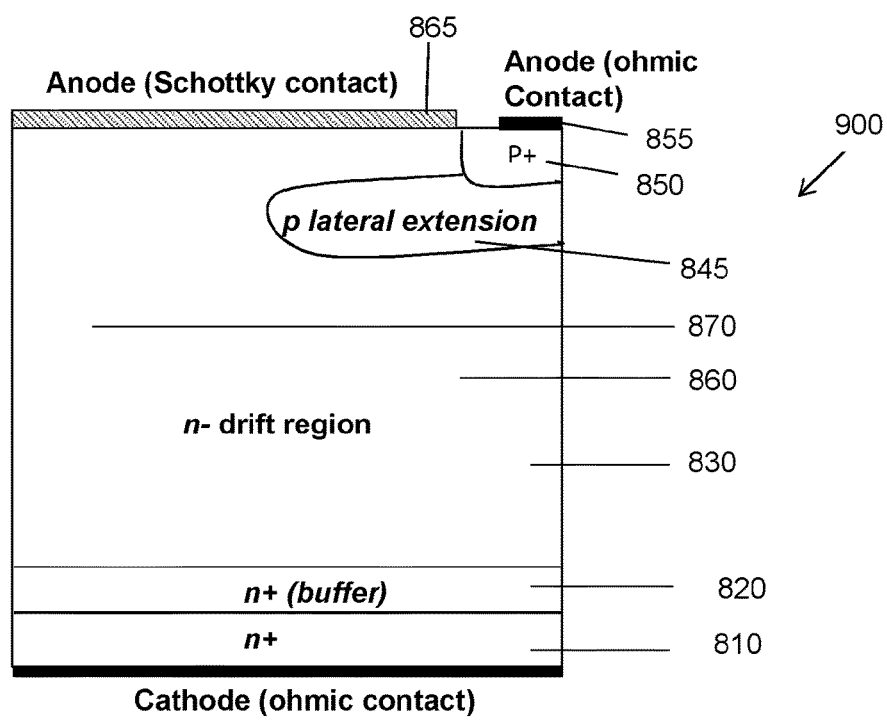
FIG. 9 illustrates a schematic cross section of a vertical Schottky diode.

Referring to FIG. 9, an example of a vertical Schottky diode 900 is shown. The Schottky diode 800 includes a substrate 810 on which an n-type epitaxial layer (or the first semiconductor region) 820 is formed to provide a cathode contact. Both the substrate 810 and the n-type epitaxial layer 820 are highly doped and thus the cathode contact is an ohmic contact. An n-type lowly doped drift region 830 is formed on the n-type epitaxial layer 820. A highly doped p+ doped region 850 (or the second semiconductor region) is formed within the drift region 830. A local anode ohmic metal contact 855 over the p+ doped region 850 is firstly formed using a high temperature. After this, a Schottky anode metal contact 865 is formed directly on the drift region 830. The Schottky contact 865 is formed using a relatively lower temperature compared to the temperature used for forming the ohmic contact on the p+ doped region 850. The Schottky anode contact 865 may be made of Nickel and the ohmic anode contact 855 may be made of titanium disilicide (TiSi2), although other suitable materials may be used. It will be appreciated that TiSi2 may be used when the Schottky diode uses 3C-SiC material. Furthermore, an Aluminium contact (not shown) is formed on the Schottky contact 865 and the ohmic contact 855 to short these together and to form a high conductivity connection layer. It will be appreciated that both the ohmic contact 855 and the Schottky contact 865 can be made using the same material.

In FIG. 9, a lateral extension 845 is formed from the deeper part of the p+ doped region 850 extending laterally into the drift region 830. The p+ doped region 850 is used to connect to a guard ring structure. At high voltage/current the p+ doped region 850 forward biases and conductivity modulates the drift region 830, reducing its resistance and moderating the power dissipated. This is advantageous for a robust power component. The lateral extension 845 extends under the edges of the Schottky contact 865 to act as a shield in a reverse bias operation. In one example, the length of the Schottky contact 865 can be about 8 μm. In alternative example, the length of the Schottky contact 865 can be about 2 μm to 40 μm, preferably about 5 to 15 μm. The length of the lateral extension 845 towards the Schottky contact 865 can be about 2 μm. In an alternative embodiment, the length of the lateral extension 845 (after the p+ doped region 850) can be about 0 μm to 100 μm, preferably about 0 μm to 40 μm (depending on the application of the device). The diode structure 900 includes two regions: (1) a PIN diode region 860 just underneath p+ doped region 850 and the lateral extension region 845, (2) a Schottky diode region 870 underneath the Schottky contact 865. The combined effect of PIN diode and Schottky diode in the structure 900 of FIG. 9 helps to turn-on the device in a relatively low voltage (about 0.1 V) and achieves a higher current without turning into a saturation region of the device characteristics.

In the structure of FIG. 9, all the layers can include silicon material. Alternatively, it is possible that the substrate 810 has silicon material and the remaining layers have 3C-SiC material. It may be also possible that all the regions of the diode 900 have 4H-SiC material. Other wide band-gap semiconductor materials such as GaN or diamond are possible to use. For example, all the regions of the diode may have GaN material. Alternatively, the substrate may have SiC material and the remaining layers may have GaN. Yet alternatively, the substrate 810 may have silicon material and the remaining layers may have GaN.

In one embodiment, when the all the layers of the diode of FIG. 9 comprise Silicon material, the semiconductor layer 820 acts as a buffer layer which mainly stops the depletion from extending to the substrate 810 in a punch-through arrangement. In such an arrangement, the buffer layer 820 can be optional.

In a further embodiment, when the substrate 810 comprises Silicon material and the rest of the layers comprise a wide bandgap material such as SiC, the first semiconductor layer 820 also acts to reduce the interface defects between the silicon substrate 810 and the SiC first layer 820. In such an arrangement, the first semiconductor layer 820 is generally provided in the structure (even though it is not a punch through arrangement).

Although the aforementioned description states the use of mainly SiC and GaN, it would be apparent to the skilled person that other polytypes of wide band-gap semiconductor materials can be equally used in the devices described above.

Although the aforementioned description illustrates mainly vertical semiconductor device, it would be appreciated that the lateral extensions can be used in lateral power devices as well, such as lateral MOSFETs, IGBTs and diodes. In lateral devices, the lateral extensions would be used as interconnects and/or insulating means from the surrounding low voltage devices. It will be also appreciated that the lateral extension disclosed above can also be used in a lateral-high-electron-mobility-transistor (HEMT) using GaN material.

It will be appreciated that the lateral extension can be introduced in a wide band-gap semiconductor based thyristor, a gate turn-off (GTO) thyristor, a gate-commutated thyristor (GCT), and/or a bipolar junction transistor (BJT). It will be appreciated that the layout of the lateral extension extending to the drift region is not limited to what has been presented as hereinbefore as long as the concept is the same.

It will also be appreciated that terms such as "top" and "bottom", "above" and "below", "lateral" and "vertical", and "under" and "over", "front" and "behind", "underlying", etc. may be used in this specification by convention and that no particular physical orientation of the device as a whole is implied.

It will be appreciated that the doping concentrations of various layers of the transistors discussed with reference to FIGS. 3 to 9 are those used in the corresponding state of the art transistors.

It will be noted that the term "first conductivity type" can refer to a p-type doping polarity and the term "second conductivity" can refer to an n-type doping polarity. However, these terms are not restrictive. It will be appreciated that all doping polarities mentioned above could be reversed, the resulting devices still being in accordance with the present invention. It will be appreciated that the emitter, collector and gate could be arranged to be out-of-plane or to be differently aligned so that the direction of the carriers is not exactly as described above, the resulting devices still being in accordance with the present invention.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A high voltage semiconductor device comprising:
   a semiconductor substrate of a second conductivity type;
   a semiconductor drift region of the second conductivity type disposed over the semiconductor substrate, the semiconductor substrate region having higher doping concentration than the drift region;
   a semiconductor region of a first conductivity type, opposite to the second conductivity type, formed on a surface of the device and within the semiconductor drift region, the semiconductor region having higher doping concentration than the drift region; and
   a lateral extension of the first conductivity type extending laterally from the semiconductor region into the drift region, the lateral extension being spaced from the surface of the device, and wherein the lateral extension is configured to reduce a peak electric field in both active and termination areas of the device.

2. A device according to claim 1, further comprising a first semiconductor region of the second conductivity type located between the semiconductor substrate and the semiconductor drift region.

3. A device according to claim 2, wherein the semiconductor substrate, the first semiconductor region, the drift region, the second semiconductor region and the lateral extension each comprise monocrystalline silicon material.

4. A device according to claim 2, wherein the semiconductor substrate, the first semiconductor region, the drift region, the second semiconductor region and the lateral extension each comprise 4H-SiC; or wherein the semiconductor substrate comprises monocrystalline silicon material, and the first semiconductor region, the drift region, the second semiconductor region and the lateral extension each comprise 3C-SiC.

5. A device according to claim 1, wherein the semiconductor region within the drift region is a second semiconductor region.

6. A device according to claim 5, wherein the lateral extension extends laterally only from a deeper portion of the second semiconductor region, and/or wherein the doping concentration of the lateral extension is lower than the second semiconductor region.

7. A device according to claim 1, wherein the lateral extension is vertically spaced from the surface of the device.

8. A device according to claim 1, wherein the entire lateral extension is vertically spaced from the surface of the device.

9. A device according to claim 1, further comprising a first ohmic contact operatively connected to the substrate and a second ohmic contact formed on the second semiconductor region, and further comprising a field plate extending from the second ohmic contact over the drift region, and wherein the lateral extension extends towards the field plate into the drift region.

10. A device according to claim 1, wherein the device is a vertical PIN diode.

11. A device according to claim 10, wherein the device is a termination structure.

12. A device according to claim 1, further comprising at least one floating guard ring of the first conductivity type laterally spaced from the highly doped semiconductor region of the first conductivity type within the drift region.

13. A device according to claim 12, further comprising a lateral extension of the first conductivity type extending laterally from the at least one guard ring into the drift region.

14. A device according to claim 1, further comprising a Schottky metal contact formed directly on the semiconductor drift region on the surface of the device, and wherein the lateral extension extends laterally towards the Schottky metal contact.

15. A method of manufacturing a high voltage semiconductor device, the method comprising:
   forming a semiconductor substrate of a second conductivity type;
   forming a semiconductor drift region of the second conductivity type disposed over the semiconductor drift region, the semiconductor substrate having higher doping concentration than the drift region;
   forming a semiconductor region of a first conductivity type, opposite to the second conductivity type, formed on a surface of the device and within the semiconductor drift region, the semiconductor region having higher doping concentration than the drift region; and
   forming a lateral extension of the first conductivity type extending laterally from the semiconductor region into the drift region, the lateral extension being spaced from the surface of the device, and wherein the lateral extension is configured to reduce a peak electric field in both active and termination areas of the device.

16. A method according to claim 15, further comprising forming a first semiconductor region of the second conductivity type between the semiconductor substrate and the semiconductor drift region.

17. A method according to claim 15, wherein the semiconductor region within the drift region is a second semiconductor region.

18. A method according to claim 15, wherein forming the lateral extension comprises applying a two stage photomasking to implant the lateral extension.

19. A method according to claim 15, wherein the lateral extension is ion-implanted using Aluminium or Boron material.

20. A method according to claim 15, further comprising vertically spacing the lateral extension from the surface of the device; and/or further comprising forming an ohmic contact on the second semiconductor material, the ohmic contact comprising titanium disilicide material; and/or further comprising forming a Schottky metal contact directly on the drift region, and further comprising forming the Schottky contact using a relatively low temperature compared to that used for forming the ohmic contact, the Schottky contact comprising nickel material.

* * * * *